United States Patent [19]

Abramovici et al.

[11] Patent Number: 5,896,401
[45] Date of Patent: Apr. 20, 1999

[54] FAULT SIMULATOR FOR DIGITAL CIRCUITRY

[75] Inventors: Miron Abramovici, Union, N.J.; Premachandran Rama Menon, Amherst, Mass.

[73] Assignee: Lucent Technologies Inc., Murray Hill, N.J.

[21] Appl. No.: 08/843,427

[22] Filed: Apr. 15, 1997

[51] Int. Cl.[6] ................................................ G06F 11/00
[52] U.S. Cl. .......................................... 371/27.4; 395/500
[58] Field of Search .................................. 371/27.4, 27.1, 371/22.1, 25.1; 364/578, 579, 580, 488–490; 395/500, 575, 183.13

[56] References Cited

U.S. PATENT DOCUMENTS

| | | | |
|---|---|---|---|
| 5,475,624 | 12/1995 | West | 364/578 |
| 5,513,339 | 4/1996 | Agrawal et al. | 395/500 |
| 5,598,344 | 1/1997 | Dangelo et al. | 364/489 |
| 5,604,840 | 2/1997 | Asai et al. | 395/11 |
| 5,633,813 | 5/1997 | Srinivasan | 364/488 |
| 5,640,403 | 6/1997 | Ishiyama et al. | 371/26 |

OTHER PUBLICATIONS

Fadi Maamari et al., Areconvergent fanout analysis for efficient exact fault simulation of combinational circuits, IEEE, 18 Fault tolerant computing symp. 122–127, Jun. 1988.

D. Dumas et al., An implicit delay fault simulation method with approximate detection threshold calculation, IEEE, International test conference, Jun. 1993.

Udo Mahlstedt et al., Simulation of non–classical faults on the gate level–the fault simulator COMSIM, IEEE trans. International test conference, Jun. 1993.

L. Burgun, F. Reblewski, G. Fenelon, J. Barbier and O. Lepape, "Serial Fault Simulation," *Proc. Design Automation Conf.*, pp. 801–806, 1996.

*Primary Examiner*—Robert W. Beausoliel, Jr.
*Assistant Examiner*—Nadeem Iqbal

[57] ABSTRACT

A fault simulator for a digital combinational circuit implements a critical path tracing algorithm in reconfigurable hardware and comprises: a forward network capable of emulating the digital combinational circuit and having primary outputs; a second forward network capable of emulating the digital combinational circuit in the presence of a stem fault and having corresponding primary outputs, the first and second forward network receiving identical input test signals at primary inputs thereof; a backward network having one primary input for every primary output of said combinational circuit and one primary output for every primary input of the combinational circuit, the backward network receiving signal values propagated to primary outputs in the first forward network in response to the input test signals; and, circuitry provided in the backward network responsive to signal values propagated in the first forward network for computing criticality of paths, the computed critical paths indicating faults in the combinational circuit that are detected by the input test signals.

20 Claims, 6 Drawing Sheets

FIG. 5
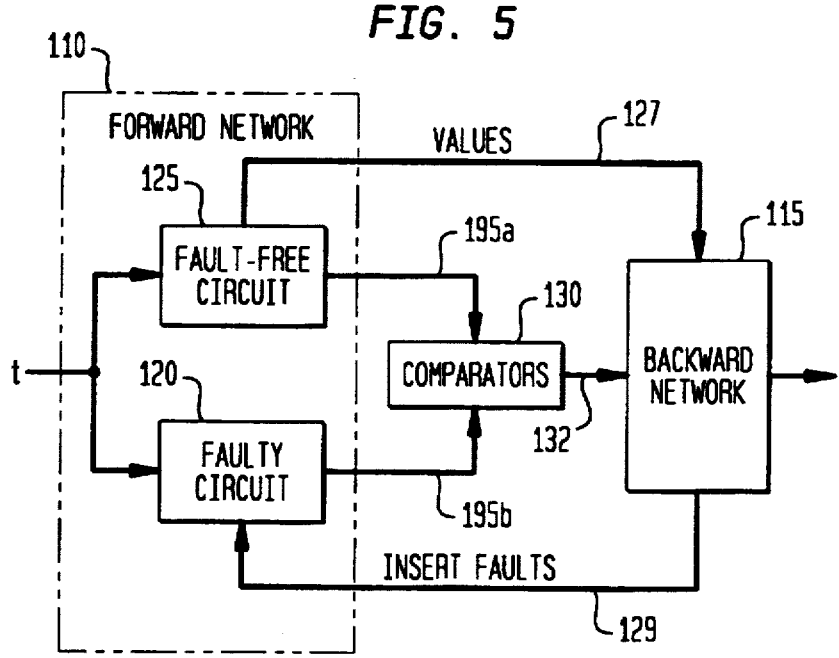
FIG. 6A
| VALUE | CODE | |
|---|---|---|
| A | $A_0$ | $A_1$ |
| 0 | 1 | 0 |
| 1 | 0 | 1 |
| x | 1 | 1 |
FIG. 6B
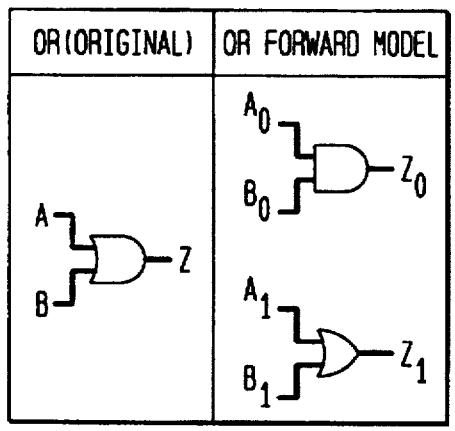
FIG. 6C
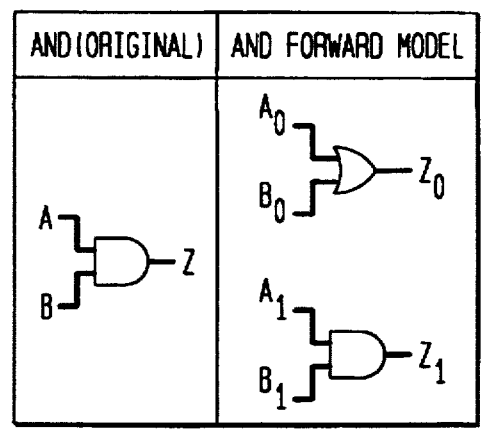

FIG. 7
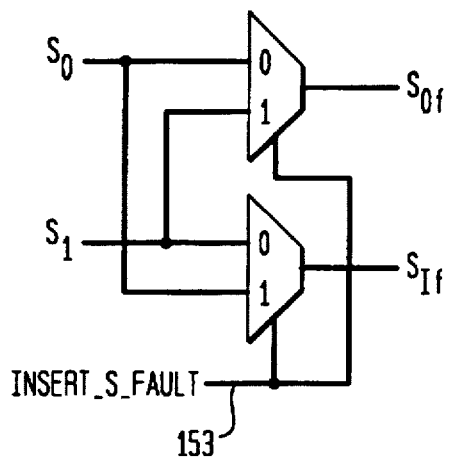
FIG. 8
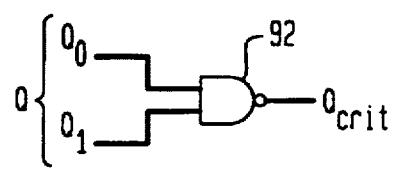
FIG. 9
| $Z_{crit}$ | A | B | $A_{crit}$ | $B_{crit}$ |
|---|---|---|---|---|
| 0 | - | - | 0 | 0 |
| 1 | 1 | 1 | 1 | 1 |
| 1 | 1 | 0 | 0 | 1 |
| 1 | 0 | 1 | 1 | 0 |
| 1 | 0 | 0 | | |
| 1 | 0 | x | 0 | 0 |
| 1 | x | 0 | | |
FIG. 11
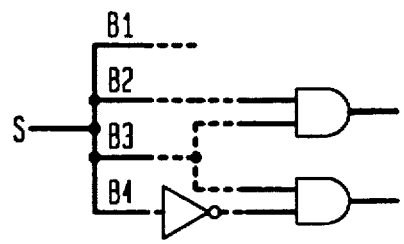

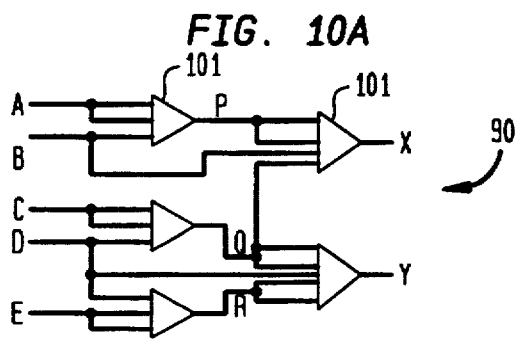
FIG. 10A
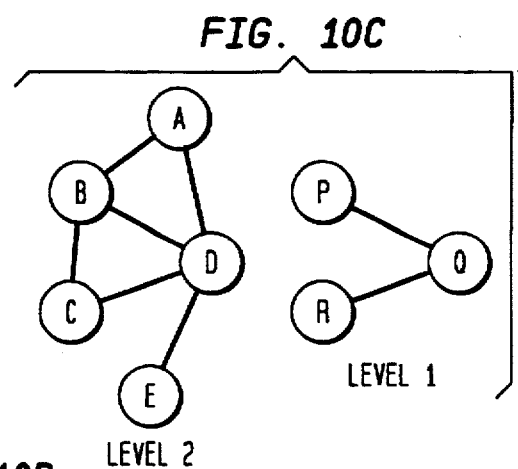
FIG. 10C
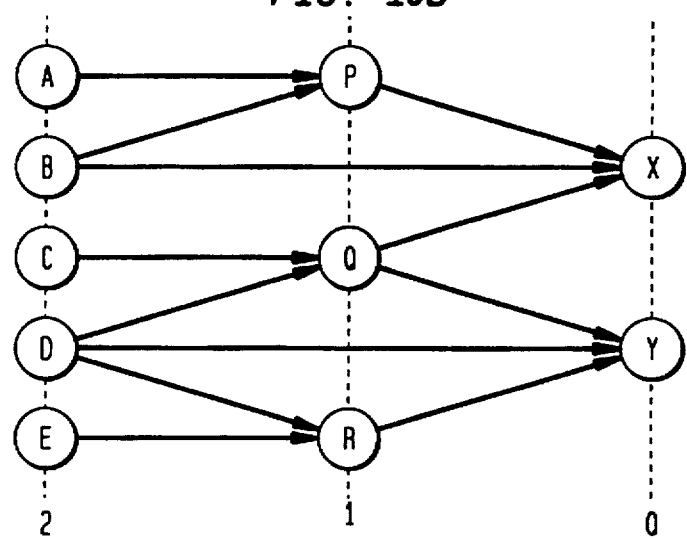
FIG. 10B
FIG. 14
| REQUESTS | | | | | FAULT INSERTED ON | | | | |
|---|---|---|---|---|---|---|---|---|---|
| A | B | C | D | E | A | B | C | D | E |
| - | - | - | 1 | - | 0 | 0 | 0 | 1 | 0 |
| 1 | - | c | - | e | 1 | 0 | c | 0 | e |
| - | - | 1 | - | e | - | 0 | 1 | 0 | e |
| 0 | 1 | - | 0 | e | 0 | 1 | - | 0 | e |
| - | 0 | - | - | 1 | - | 0 | - | 0 | 1 |
| - | - | - | - | 0 | - | - | - | - | 0 |

FAULT SIMULATOR FOR DIGITAL CIRCUITRY

FIELD OF THE INVENTION

The instant invention relates generally to automated fault simulation techniques, and, more particularly, a hardware approach to fault simulation implementing a critical path tracing algorithm.

BACKGROUND OF THE INVENTION

Fault simulation is the simulating of a circuit in the presence of faults. Comparing the fault simulation results with those of the fault-free simulation of the same circuit simulated with the same applied test T, the faults detected by T can be determined. One use of fault simulation is to evaluate (grade) a test T which is given by its fault coverage, i.e., which is the ratio of the number of faults detected by T to the total number of simulated faults. Fault simulation can be used with different fault models, such as stuck-at faults, bridging faults, etc.

Fault simulation plays an important role in test generation, by determining the faults accidentally detected by a test vector or test sequence generated for a specific target fault. Then all the detected faults are discarded from the set of simulated faults, and a new target fault is selected from the remaining ones. This avoids the much greater computational effort involved in generating tests by explicitly targeting the accidentally detected faults.

Fault simulation is extensively used in fault diagnosis. One technique for doing so employs precomputed fault dictionaries, where all possible faulty responses are stored for comparison with the actual response of the device under test. Another technique, used as part of post-test diagnosis, first isolates a reduced set of "plausible" faults, and then simulated only these faults to find the one(s) whose response agrees with the actual response.

In *Digital Systems Testing and Testable Design*, by M. Abramovici, M. A. Breuer, and A. D. Friedman, I.E.E.E. Press, 1994, many efficient software-implemented fault simulation algorithms are discussed. However, complex circuits and long test sequences make fault simulation in software a very time-consuming computational process.

Many different hardware-based approaches have been tried to speed up fault simulation, e.g., methods dividing the set of faults among parallel processors executing the same algorithm, such as described in "Fault Simulation in a Distributed Environment," *Proc Design Automation Conf.*, pp. 686–691, 1988 by P. A. Duba, R. K. Roy, J. A. Abraham, and W. A. Rogers. Unfortunately, these usually result in a speed-up which is a sublinear function of the number of processors. While hardware accelerators specially built for fault simulation do achieve higher performance, such performance comes at a significantly higher cost. Also, a special-purpose processor with a hardwired algorithm is a very inflexible solution. By contrast, a microprogrammed multiprocessor architecture, such as described in "Fault Simulation on a Pipelined Multiprocessor System,"*Proc. Intn'l Test Conf.*, pp. 727–734, 1989, by P.Agrawal, V. D. Agrawal, and K. T.Cheng, offers more flexibility (both logic and fault simulation are implemented on the same machine), but the performance is lower.

Logic emulation systems are increasingly being used for rapid ASIC prototyping, and to support hardware-software co-design and in-system verification. One recent solution, such as described by K.-T.Cheng, S.-Y.Huang, and W.-J. Dai, in "Fault Emulation: A New Approach to Fault Grading, "*Proc. Int'l. Conf. on Computer-Aided Design*, pp. 681–686, Nov. 1995 and by L. Burgun, F. Reblewski, G. Fenelon, J. Barbier and O. Lepape,"Serial Fault Simulation,"*Proc. Design Automation Conf.*, pp.801–806, 1996, has implemented logic emulators for serial fault simulation, where faults are inserted one-at-a-time in the emulation model of the circuit. The advantage is that fault simulation runs at hardware speed, without having to build any special purpose hardware, and it runs on computing platforms which are becoming widely available.

An important requirement is to have an efficient way of performing fault insertion that avoids full reconfiguration of the emulator for different faults. In the K.-T.Cheng et al. reference, a fault insertion circuit is added to the emulation model, so that faults are inserted without any reconfiguration, just by changing logic values in the model. In the L.Burgun et al. reference, fault insertion takes advantage of the incremental reconfigurability of the target emulator, which allows only a small portion of the model to be reconfigured. Although the K.-T.Cheng et al. reference describes a speed-up technique that allows several faults to be concurrently simulated, the performance of this process, referred to as fault emulation, is still limited by its serial nature.

Thus, it would be highly desirable to overcome the drawbacks mentioned-above by providing a new approach to implement fault simulation on reconfigurable hardware.

Moreover, it would be highly desirable to provide a new approach to implement fault simulation on reconfigurable hardware by implementing a critical path tracing algorithm, an implicit fault processing technique which is described in "Critical Path Tracing: An Alternative to Fault Simulation", *IE.E.E. Design & Test of Computers*, 1984, by M. Abramovici, P. R. Menon, and D. T. Miller, which is incorporated by reference herein. In critical path tracing, explicit fault enumeration is not required, as most faults are processed implicitly. Instead, for every input vector, critical path tracing first simulates the fault-free circuit, then it determines the detected faults by ascertaining which values are so-called critical. For instance, a line "l" has a critical value v in test t if t detects the fault l s-a-$\bar{v}$ (stuck-at-v). Such as a line with a critical value in t is said to be critical in t. Finding the lines critical in a test t, enables immediate determination of the faults detected by t. As a starting point, the primary outputs (POs) with binary values are critical in any test. The other critical lines are found by a process starting at the POs and backtracing paths composed of critical lines, called critical paths.

A gate input is sensitive in a test t if complementing its value changes the value of the gate output. If a gate output is critical, then its sensitive inputs are also critical. This provides the basic rule for backtracing critical paths through gates. FIGS. 2(*a*) and 2(*b*) illustrate a combinational circuit having the sensitive gate inputs marked by dots and the critical paths indicated by heavy lines.

In the critical path tracing algorithm, when a critical path being traced reaches a fanout stem, stem analysis is performed to determine whether the stem is critical by injecting the appropriate fault at the stem and checking whether its fault effects propagate to any PO. For example, as shown in FIG. 2(*a*), the stem indicated as "B" is not critical, since the fault effects of B s-a-0 propagate along two paths with different inversion parities that cancel each other at the inputs of the reconvergence gate F (Fault effects are denoted by good_value/faulty_value). However, as shown in FIG.

2(b), the fault effect propagating along the path (B, BI, D, F) reaches F and therefor B is critical.

In many cases, stem criticality can be determined without stem analysis, based only on criticality of the fanout branches. Such stems can be identified by analyzing the reconvergent structure of the circuit in a preprocessing phase. For example, in FIG. 3(a), both paths that fan out from B and reconverge at E have the same inversion parity. Hence fault effects originating at B can never cancel each other, and, whenever B1 or B2 is critical, the stem can be marked as critical without simulating the stem fault.

FIG. 3(b) illustrates a situation when a critical path is not continuous. Although backtracing stops at gate E, (which has no sensitive inputs), stem B is critical since the effect of B s-a-0 is observed at E. In the case exemplified in FIG. 3(a), whenever gate E is critical and D=E=0, stem analysis must be performed for B, a condition which may be identified during a preprocessing stage. A detailed discussion of conditions for stem analysis is given by P. R. Menon, Y. Levendel, and M. Abramovici in "SCRIPT: A Critical Path Tracing Algorithm for Synchronous Sequential Circuits," *IE.E.E. Transactions on Computer-Aided Design*, June 1991.

SUMMARY OF THE INVENTION

The instant invention is a new approach to fault simulation that utilizes reconfigurable hardware to implement a critical path tracing algorithm. Such a reconfigurable hardware-based approach implements a critical path tracing algorithm having a forward network model of the circuit to be simulated for propagating values and a backward network model of the circuit to be simulated for propagating criticality.

In accordance with the invention, there is provided a fault simulator for a digital combinational circuit comprising: a forward network capable of emulating the digital combinational circuit and having primary outputs; a second forward network capable of emulating the digital combinational circuit in the presence of a stem fault and having corresponding primary outputs, the first and second forward network receiving identical input test signals at primary inputs thereof; a backward network having one primary input for every primary output of said combinational circuit and one primary output for every primary input of the combinational circuit, receiving signal values propagated to primary outputs in the first forward network in response to the input test signals; and, circuitry provided in the backward network responsive to signal values propagated in the first forward network for computing criticality of paths, the computed critical paths indicating faults in the combinational circuit that are detected by the input test signals.

Advantageously, the reconfigurable hardware-based approach of fault-simulation is faster by at least one order of magnitude than serial fault emulation used in prior work.

BRIEF DESCRIPTION OF DRAWINGS

FIG. 5 shows the block diagram of the fault simulation circuit FSIM(C) of FIG. 1.

FIG. 6(a) illustrates the 3-valued logic coding used in the forward network model of the combinational circuit.

FIG. 6(b) illustrates the implementation of an OR gate in the forward network model of the combinational circuit.

FIG. 6(c) illustrates the implementation of an AND gate in the forward network model of the combinational circuit.

FIG. 7 shows the fault injection circuit for a stem S.

FIG. 8 illustrates an example circuit for feeding a critical value at a PO of the forward network to a corresponding PI of the backward network.

FIG. 9 illustrates the truth table for computing critical values for an AND gate.

FIG. 10(a) illustrates fanout-free regions 101 of a hypothetical digital combinational circuit 90.

FIG. 10(b) illustrates a stem dependency graph for the hypothetical circuit 90 of FIG. 10(a).

FIG. 10(c) illustrates a stem incompatibility graph for the hypothetical circuit 90 of FIG. 10(a).

FIG. 11 illustrates a hypothetical stem S having four fanout branches B1–B4.

FIG. 14 illustrates stem selection logic implemented for level 2 in the hypothetical circuit 90 of FIG. 10(a).

DETAILED DESCRIPTION OF THE INVENTION

Figure 1:
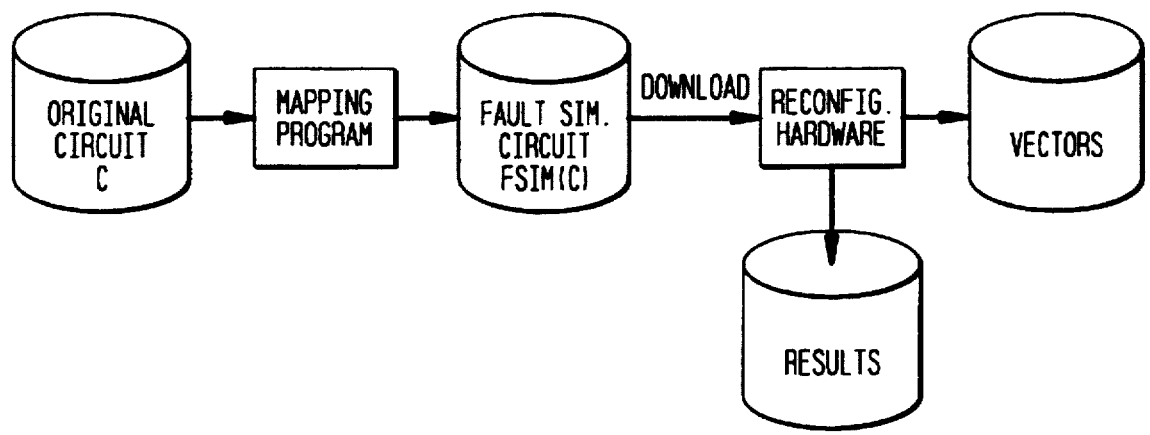
FIG. 1 is a general data flow diagram of the reconfigurable hardware-based fault simulation technique of the invention.

FIG. 1 illustrates the data flow of the reconfigurable hardware-based fault simulation apparatus of the invention. As shown in FIG. 1, the main step comprises a mapping of the original digital combinational circuit C into a fault simulation circuit FSIM(C), which implements a fault simulation algorithm for C. The FSIM(C) is much larger and more complex than C, as it implements a non-trivial algorithm in hardware.

The fault simulation hardware is designed specifically for a single circuit. This is one of the advantages provided by the reconfigurable hardware. The fault simulation circuit is downloaded and run in an emulator or in any other reconfigurable hardware.

To implement the critical path tracing algorithm in hardware, it is necessary to generate two distinct models of the digital combinational circuit C: a forward network for propagating values and a backward network for propagating criticality. The backward model implements a backward traversal through the circuit C, i.e., to enable "backtracing" of criticality.

Figure 4:
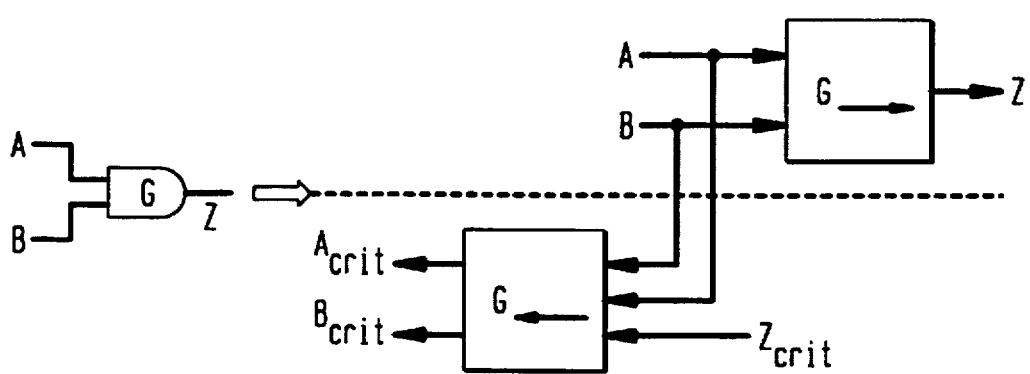
FIG. 4 illustrates the mapping of a gate G in the original combinational circuit into a forward network model G→, and a backward network model gate G←.

Thus, as illustrated in FIG. 4, every gate G in the original circuit C is mapped into an element G→, in the forward network and an element G← in the backward network. In FIG. 4, inputs A, B, and output Z of the original combinational circuit represent the values of their corresponding signals, while $A_{crit}$, $B_{crit}$ and $Z_{crit}$ represent their criticalities. The values 0, 1, and x represent the logic values used, where x stands for unknown or unspecified, and the criticality indicators are binary values. As will be explained, the computation of criticality requires the knowledge of corresponding signal values propagated in the forward network.

FIG. 5 illustrates the block diagram of the fault simulation circuit FSIM(C) of FIG. 1. As shown in FIG. 5, there is provided a forward network 110 and, a backward network 115. In the forward network 110 there is provided a fault-free (good) circuit model 125 and a faulty circuit model 120. The good circuit model 125 performs 3-valued (zero-delay) simulation of the original circuit for each input test vector "t" while the faulty circuit 120 is a copy of the fault-free circuit with additional logic that allows stem-fault insertion for every stem S that needs to be analyzed.

FIG. 6(a) illustrates the coding used in the forward network for modeling digital logic gates in the 3-valued logic system. To represent the value of a signal A, two bits, $A_0$ and $A_1$, are used, with $A_0$ meaning A has the value of either 0 or x; $A_1$ meaning that A has the value of either 1 or x; and $A_0=A_1=1$ meaning that A has unknown value "x". FIG. 6(b) and FIG. 6(c) respectively illustrate the mapping process (FIG. 1) used to implement the forward network model of an OR gate (shown as the gate at left of FIG. 6(b)) and the mapping process used to implement the forward network model of an AND gate (shown at left of FIG. 6(c)) in the 3-value logic system. In the forward network model gate implementations shown in FIGS. 6(b) and 6(c), the equations for $Z_0$ and $Z_1$, are easy to derive. For example, in FIG. 6(c), Z has the value of 0 or x when A is 0 or x, OR when B is 0 or x ($Z_0=A_0+B_0$). Z has the value of 1 or x when both A AND B are 1 or x ($Z_1=A_1 \cdot B_1$). The mapping for an inverter (not shown) with input A and output Z is given by $Z_0=A_1$ and $Z_1=A_0$, with the negation being realized without logic and implemented just by swapping $A_0$ and $A_1$.

FIG. 7 shows the fault injection circuit 150 for a stem S for effecting fault injection only in the faulty circuit 120 of the forward network. The Insert-S-fault signal 153 generated in the backward network during stem analysis, is an input signal provided to the faulty circuit for inverting the current value of a stem S by swapping current $S_0$ and $S_1$ values (in 3-value logic system) to complemented $S_{0f}$ and $S_{1f}$ values. It should be understood that the stem fault injection logic is embedded within the logic generating values of $S_0$ and $S_1$, with the additional Insert-S-fault signal 153 input.

Referring back to FIG. 5, the backward network 115 has one primary input ("PI") for every primary output ("PO") and one PO for every PI in the original circuit. It also receives the value of every signal value propagated in the fault-free circuit 125 of the forward network 110 along signal line 127, and, as will be explained, computes criticality values for inputs of gates whose outputs are critical. That is, for every signal A in the original circuit, the backward network computes $A_{crit}$ which is "1" when A is critical. As shown in FIG. 8, for every PO Q, (implementing 3-valued logic), the backward network 115 provides a NAND gate 92 whose output is $Q_{crit}=Q_0 \cdot Q_1$. i.e., $Q_{crit}$ is 1 only when Q has a binary (non-x) value. Asserting POs with binary values as critical starts the backtracing process.

FIG. 9 illustrates a truth table implemented in the backward network of a combinational element G← that computes the criticality for an AND gate having output Z and inputs A and B. Thus, for example, as shown at line 94 in the table of FIG. 9, if the output of the AND gate is not critical, i.e., $Z_{crit}$ is equal to "0", then nothing further needs to be done to the circuit as the inputs are not critical. If however, as shown at line 95 if the output $Z_{crit}$ is critical, and both inputs A and B are equal to "1", then both $A_{crit}$ and $B_{crit}$ values are computed as equal to "1". As shown at lines 96 and 97, if the output $Z_{crit}$ is critical, and one of the inputs A and B is equal to "1", while the other is zero, then the critical input of the gate in the backward network will be at the controlling input, i.e., the sensitive input, in the forward network. Thus, in line 96, the critical input is computed as $B_{crit}$ (set equal to "1") as B (=0) in the forward network model is the controlling input for that gate, and, likewise, as shown in line 97, the critical input is computed as $A_{crit}$ (set equal to "1") as A (=0) is the controlling input of the gate in the forward network. In all other cases of the truth table of FIG. 9, there are no sensitive inputs so no critical values are assigned. Thus, backtracing through gates involves only combinational logic, and it should be understood that similar tables can be readily derived to determine critical values in OR, NOR, NAND and other combinational elements in accordance with the analysis as explained herein with reference to FIG. 9.

The backward network 115 also assigns the signals that control stem-fault insertion in the forward network and communicates stem-fault insertion values along signal line 129 to the forward faulty circuit model 120. By comparing the fault-free PO values 195a with the corresponding PO values obtained in the presence of stem faults 195b, the comparators circuit 130 determines whether these faults are detected by comparing PO binary value differences. Information of detected faults from the comparators block 130 is communicated along signal line 132 to the backward network to compute criticality of the analyzed stems.

The computation and back-propagation of critical values in the backward network 115 is done at the same time, i.e., in parallel. However, as mentioned above, the critical path tracing algorithm requires that whenever the backtracing of critical paths arrive at a stem, S, stem analysis is to be performed to determine if the stem is critical and, if so, to continue propagating criticality in the circuit. This tends to be a time-consuming part of the hardware-implementation of the algorithm as the continuation of backtracing from a stem S must wait until the stem fault has been inserted in the forward network and the comparators circuit 130 reports that its effects have propagated to a PO.

Figure 2A:
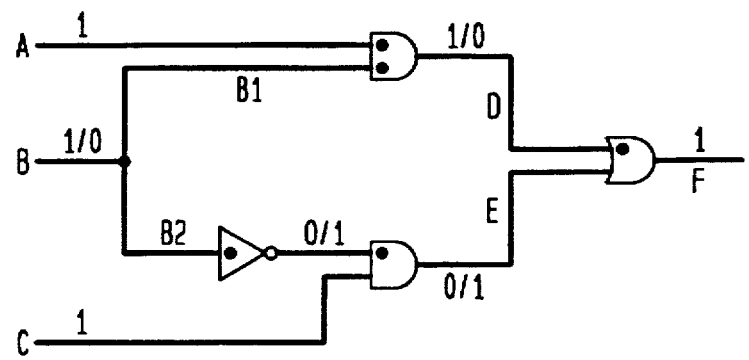
FIGS. 2(a) and 2(b) illustrate critical path tracing in example digital combinational circuits.
Figure 2B:
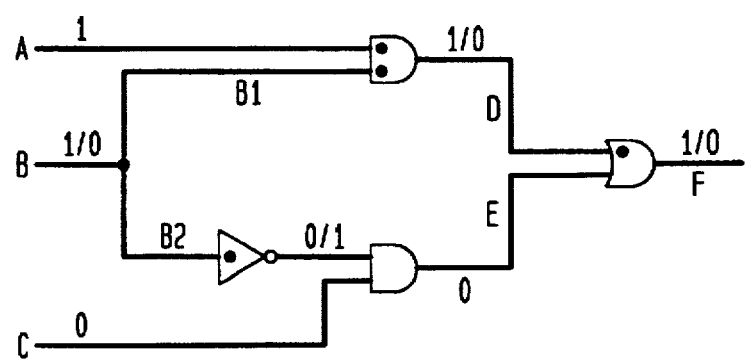
Figure 3A:
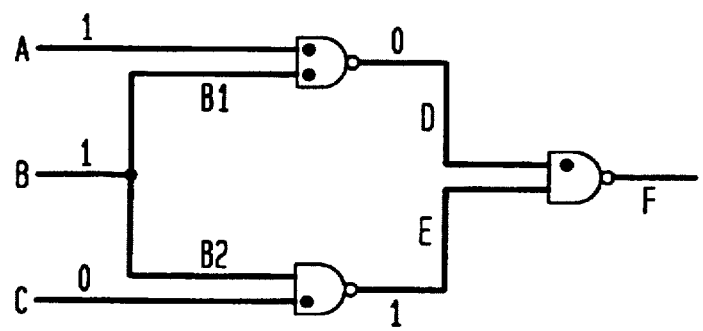
FIGS. 3(a) and 3(b) illustrate stem analysis in example digital combinational circuits.
Figure 3B:
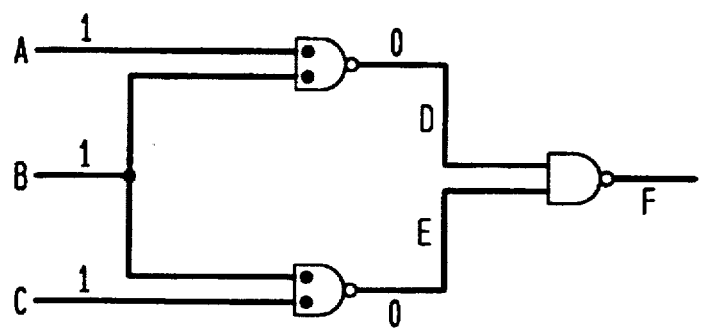

One way to improve processing time is to realize that not all stems require analysis, as stems whose fanouts do not reconverge and those with equal parity reconvergent paths may be marked as critical without further analysis. Furthermore, it is not always necessary to propagate the fault effects of stems "all the way" to POs. For example, as shown in FIG. 2(b), if the output of element F is not a PO, and a fault effect propagates to F, it is also guaranteed to also propagate to the same POs reached by the fault effects from F, because F has already been proven as critical, i.e., F is a dominator of B because all paths from B to any PO must go through F. Thus, the detection of a stem fault can also be determined at a dominator of a stem. An observation point O of a stem S is such that the detection of stem S can be determined by observing at O a fault effect propagated from S.

Another way to speed up serial fault emulation is to concurrently insert groups of independent faults, i.e., faults that are non-interacting and do not affect any common area of the circuit. Grouping of independent and non-independent faults may be done statically, as in a preprocessing step, or, in the preferred embodiment, dynamically, where sets of stems whose faults may be concurrently simulated are determined during backtracing. By dynamic grouping, sets of stems to be analyzed changes with the applied vector.

The preferred method for dynamic stem grouping is now described in view of FIGS. 10(a)–10(c). There is shown in FIG. 10(a) a fanout structure of a hypothetical digital combinational 90 circuit having fanout-free regions (FFRs) are denoted as triangles 101. The inputs of a FFR 101 are shown as fanout branches but they may be primary inputs without fanout branches. The output of a FFR is either a stem or a PO. The stems to be analyzed are first assigned levels as follows: a directed graph is first constructed whose vertices are stems to be analyzed, and POs. The graph has an edge from vertex i to vertex j if there is a direct path in the circuit from stem i to stem j, that does not pass through any other stem. Treating POs as level-0 vertices, the level $L_v$ of vertex v is computed as $L_v = \max\{L_i\} + 1$, where i ranges over all successors of v. FIG. 10(b) illustrates the directed graph for the hypothetical circuit 90 of FIG. 10(a). As illustrated in FIG. 10(b), the outputs X and Y are POs and thus are designated at Level-0; the outputs P, Q, and R are at Level-1, and inputs A,B,C,D, and E are at Level-2. Stem criticality is determined in increasing level order, so that the status of all stems at level k is known when stems at level k+1 are analyzed.

A further distinction is made for the stems in each level. For example, stems are determined to be "compatible" if their fault effects cannot interact before reaching observation points for the stems. Faults on compatible stems may be inserted and simulated concurrently in to the preferred embodiment. In FIG. 10(a), for example, points P and X are observation points for A, and X and Y are observation points for Q. When several observation points for a stem S are on the same path from S, only the observation point closest to S will be considered. Thus, for example, the observation point P will be used as the observation point for A. Stems A,C, and E are thus pairwise compatible because their fault effects cannot interact before reaching their respective observation points, P,Q, and R and, hence, faults may be simultaneously inserted at these stems. Although stems A and C are compatible, they are not independent because they feed the same PO, i.e., output X. Generally, there are many more stems that may be concurrently simulated based on compatibility than based on independence.

Rather than determine the compatibility relation between stems, "incompatible" stems may be identified. Incompatible stems are stems that may not be concurrently simulated because their fault effects interact with those from another stem before reaching an observation points. FIG. 10(c) illustrates a stem incompatibility graph for Level-1 and Level-2 of the example circuit of FIG. 10(a). As shown in the incompatibility graph at Level-2, stem D is incompatible with all the other stems because its fault effects may interact with those from the other stem (A, B, C, or E) before the observation points for D (outputs X or Y) are reached. An incompatibility graph, or, conversely, a compatibility graph (not shown) may be used in building the backward network 115, as long as the logic is setup so that only compatible stems are grouped.

The stem analysis as performed by the FSIM(C) circuit of FIG. 5, in reconfigurable hardware, is now described with reference to FIG. 11 which illustrates an example fan-out structure of a stem S provided in an example combinational digital circuit C with four (4) divergent branches indicated as B1–B4. As shown in FIG. 11, when the backward network propagates along critical paths backward, it will know that branch B1does not converge with any of the branches (non-reconvergent), and will thus propagate a critical value to the stem S. Branches B2 and B3 do converge with the same inversion parity so that a critical value arriving at branch B2 could be propagated through S with out any problem. However, as branches B3 and B4 converge with opposite parity, then further stem analysis is performed for the stem having a critical value arriving at either branch B3 and B4.

For every stem S in the digital combinational circuit, the backward network 115 is provided with a stem analysis circuit determined through pre-processing and mapped into the fault simulation circuit FSIM(C) corresponding to the original digital combinational circuit. Thus, in the example fanout structure of stem S having branches B1–B4 illustrated in FIG. 11, a stem analysis circuit 200, such as shown in FIG. 12, would be provided to determine stem criticality.

Figure 12:
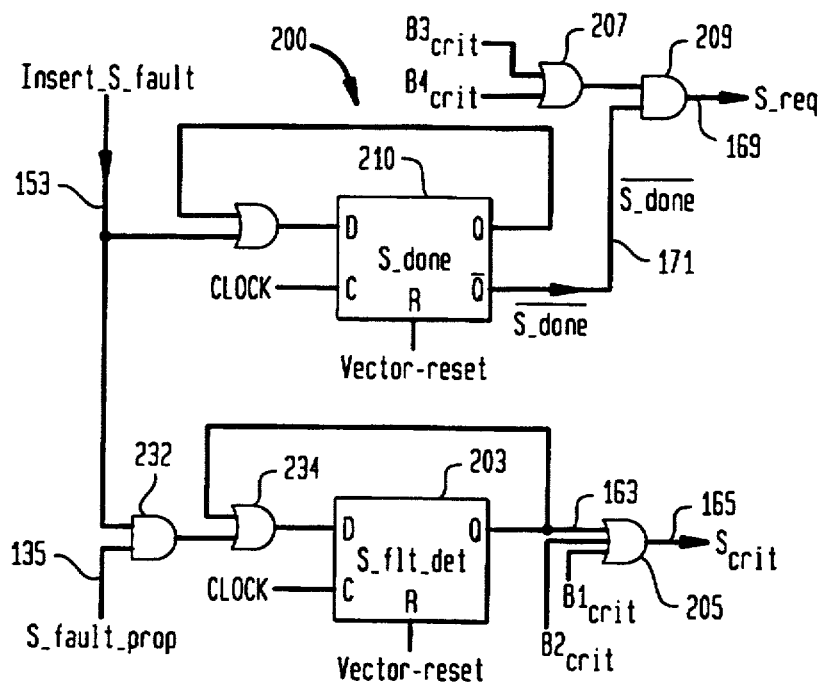
FIG. 12 depicts the stem analysis circuit 200 in the backward network.

The stem analysis circuit 200 shown in FIG. 12 contains circuitry that includes an S__flt__det flip-flop 203, having an output signal 163 that is input to an OR gate 205 along with inputs indicating criticality of branches B1 and B2. The output $S_{crit}$ signal 165 of the OR gate 205 is the line indicating the criticality of the stem S, and, as explained above with reference to FIG. 11, when either $B1_{crit}$ or $B2_{crit}$ is determined as critical, stem S will automatically be determined as critical, i.e., $S_{crit}$ is asserted equal to "1" in the stem analysis circuit 200. In such a case, no further stem analysis for stem S is required. If further stem analysis is required, for instance, when either value $B3_{crit}$ or $B4_{crit}$ is a critical value, then the stem analysis circuit 200 asserts a request for stem analysis, S__Req signal 169, in FIG. 12 provided that S has not yet been analyzed for the current input vector. As shown in the stem analysis circuit of FIG. 11, the information as to whether stem S has yet been analyzed for the current input vector is stored in the S__done flip-flop 210 at S__Done (complement) output signal 171. When S__Done signal 171 is logic 0, then regardless of whether $B3_{crit}$ or $B4_{crit}$ are asserted at logic gates 207 and 209, the S__Req signal 169 will not be asserted and no further stem analysis for that stem is performed.

Figure 13:
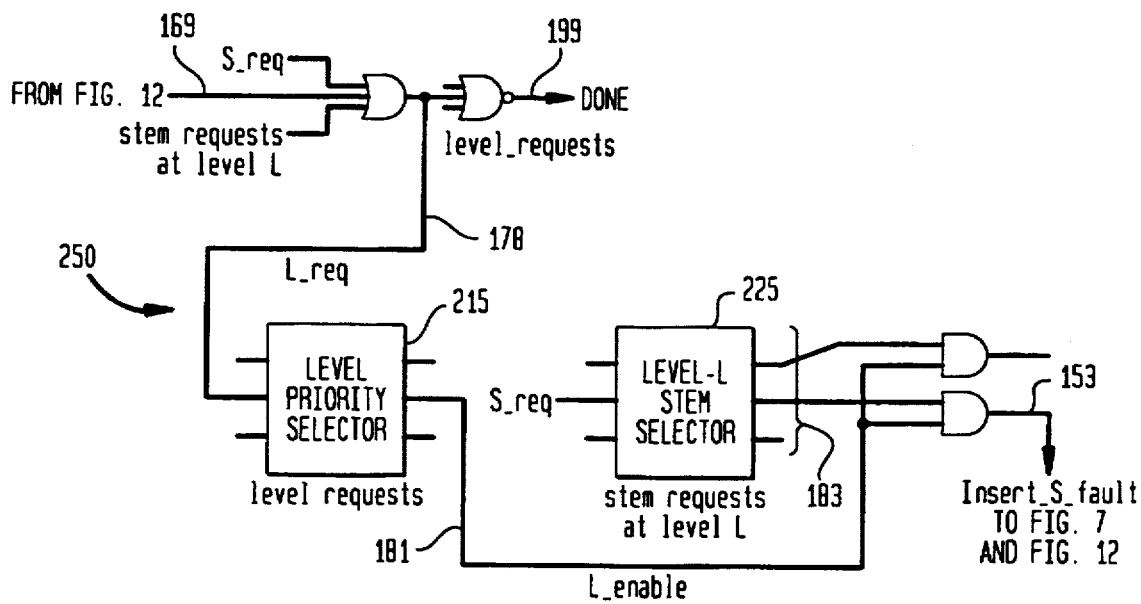
FIG. 13 depicts the stem group and level request circuit 250.

The requests from all stems that may require analysis by asserting at least one stem request S__req signal 169 are sent to the level and stem selection circuit 250 shown in FIG. 13. When a stem request is granted, the fault insertion Insert__S__fault signal 153 is asserted for all stems at the same level that are simultaneously analyzed. The fault insertion mechanism is as described with reference to FIG. 7.

Referring back to FIG. 12, the S__fault__prop signal 135 is the OR of the outputs 132 from the comparators circuit 130 (FIG. 5) that correspond to observation points of stem S, and indicates whether a fault effect propagates to at least one of them. If these errors have been caused by inserting the stem fault of S in the forward network (after invoking Insert__S__fault signal 153), then the S__fault__prop signal 135, Insert__S__fault signal 153 and logic circuits comprising AND gate 232 and OR gate 234 and the S__flt__det flip-flop 203 is set to record the result of the stem analysis for S, which, in turn, leads to assertion of $S_{crit}$.

As shown in FIG. 12, the same clock signal 190 that sets S__flt__det flip-flop 203 also sets the S__done flip-flop 210. Both flip-flops remain locked in the 1 state until Vector-reset signal 192 is activated when the next test vector input is simulated; this insures that stem S is not analyzed more than once. The simulation of the current test vector is complete when all level requests signals are 0, which results in Done signal 199 equal to logic 1.

FIG. 13 shows the circuit 250 for selecting one or more stem faults for simultaneous insertion. First of all, it is assumed that if the S is a stem at level L, then at least one stem request S__req signal 169 at this level sets the level request L__req signal 178. If several levels have requests, the lowest level is selected by a priority selector circuit 215, whose outputs are levelenable L__enable signals 181. It is understood that an output L__enable signal 181 corresponds to an asserted L__req signal 178. The logic implemented by the stem selector circuit 225 for Level $L_v$, reflects the stem incompatibility graph for that level. The outputs 183 of the stem selector circuit 225 are ANDed with L_enable signal 181 to produce the fault insertion signals 153 for the selected set of compatible stems. The simulation of the current vector is complete when all level requests signals are 0, which results in Done=1.

FIG. 14 illustrates the truth table 201 implemented by the stem selection circuit 225 for the level-2 incompatibility graph shown in FIG. 10(c). For an incompatibility graph with n vertices, to the truth table 201 has n+1 rows (n=5 in the example provided in FIG. 10(c)). Each one of the first n rows corresponds to a stem, and a row for a stem S is constructed as follows: The first set 228 of n columns have a request pattern consisting of a definite request (1) for S, no request (0) for the stems whose rows are before S, and "don't care" requests ("-") for the stems incompatible with S. or potential requests for stems compatible with S. The potential requests are denoted with small-case variables with "c" being a variable associated with stem C and having a value denoting a request for C. The second set 229 of n columns show the corresponding pattern of fault insertion signals: 1 for S, 0 for the stems incompatible with S and for stems whose rows are before S, and the request variables for the stems compatible with S. For example, the first row 202a asserts a request for fault insertion at stem D, in the hypothetical circuit of FIG. 10(a) and the corresponding fault insertion pattern indicating a fault inserted at stem D. The second row 202b corresponds to a fault request for stem A of FIG. 10(a), a request from stem B, and potential requests from stems C and E, and no request from D which was analyzed in the first row. The corresponding fault-insertion pattern for row 202b specifies fault insertion on A, precludes fault insertion on B and D which are incompatible with A, and allows potential insertions on C and E, which are compatible with A. The last row 202c has an all-0 pattern to cover the case of no requests. It should be understood that such a truth table 201 is complete and it correctly handles all $2^n$ possible input patterns for the example circuit of FIG. 10(a).

In the preferred embodiment, after the fault-free values are computed, one group of stems is analyzed in every clock cycle. During each clock period, logic values propagate from the inserted faults to observation points, and criticality values must propagate from stems to PIs. Thus, the clock rate should allow for the worst case which requires full propagation through both the forward and the backward networks.

The foregoing merely illustrates the principles of the present invention. Those skilled in the art will be able to devise various modifications, which although not explicitly described or shown herein, embody the principles of the invention and are thus within its spirit and scope.

What is claimed is:

1. A fault simulator for a digital combinational circuit comprising:

a) a forward network capable of emulating said combinational circuit;

b) a second forward network capable of emulating said combinational circuit in the presence of a stem fault, said first and second forward network both receiving identical input test signals at primary inputs thereof;

c) a backward network having one primary input for every primary output of said combinational circuit and one primary output for every primary input of said combinational circuit, said backward network receiving signal values propagated to primary outputs in said first forward network in response to said input test signals; and d) means in said backward network responsive to signal values propagated in said first forward network for computing criticality of paths, wherein said computed critical paths indicate faults in said combinational circuit that are detected by said input signals, and wherein said means for computing criticality of paths include means for determining criticality of each stem from critical values of its connected fanout branches.

2. A fault simulator for a digital combinational circuit as claimed in claim 1, wherein said means for computing criticality of paths includes means for determining criticality of inputs at a logic gate located in said combinational circuit from values present at said inputs of said logic gate in said first forward network and criticality value of the output of said gate.

3. A fault simulator for a digital combinational circuit as claimed in claim 1, further including comparing means for comparing values at observation points in said first and second forward networks, said means for determining criticality of each stem including means for injecting a fault at a said stem in said second forward network, said second forward network propagating fault effect values towards an observation point in said second forward network, said comparing means comparing values at observation points of said first and second forward networks to detect presence of said inserted fault in said second forward network, whereby said stem is critical when said injected fault is detected.

4. A fault simulator for a digital combinational circuit as claimed in claim 3, wherein said means for injecting a fault at said stem in said second forward network includes means for swapping the present value at said stem with its complement.

5. A fault simulator for a digital combinational circuit as claimed in claim 3, wherein stems contained in said combinational circuit are organized by levels, wherein an initial level consists of primary outputs of said digital combinational circuit, and stems at any subsequent level i are fed only by stems at levels greater higher than i, said means for computing criticality of stems includes computing criticality of stems in increasing level order.

6. A fault simulator for a digital combinational circuit as claimed in claim 5, wherein said means for determining criticality at each said stem in said second forward network includes means for issuing a request for a fault insertion of a stem at a level i, and means for dynamically grouping one or more stems at level i that are compatible.

7. A fault simulator for a digital combinational circuit as claimed in claim 6, wherein each compatible stem at a level i has fanout branches that propagate fault effect values capable of reaching different observation points in said second forward network.

8. A fault simulator for a digital combinational circuit as claimed in claim 7, wherein said means for injecting a fault at said stem in said second forward network includes simultaneously injecting a fault at each stem found compatible at said level, and propagating fault effect values to observation points for determining criticality of each compatible stem.

9. A fault simulator for a digital combinational circuit as claimed in claim 8, further including a periodic time base, wherein faults are simultaneously injected at each compatible stem at a level i are computed in one clock period.

10. A fault simulator for a digital combinational circuit as claimed in claim 8, further including means for preventing fault insertion at a stem whose criticality has already been determined.

11. A fault simulator for a digital combinational circuit as claimed in claim 1, wherein each said first forward and second forward networks contain emulated logic gates capable of processing 3-valued logic.

12. A fault simulator for a digital combinational circuit as claimed in claim 1, wherein said simulator implements a critical path tracing algorithm using reconfigurable hardware circuitry.

13. A method for simulating faults in a digital combinational circuit comprising:
   a) providing a forward network capable of emulting said combinational circuit;
   b) providing a second forward network capable of emulating said combinational circuit in the presence of a stem fault, said first and second forward network both receiving identical sets of input test signals at primary inputs thereof;
   c) providing a backward network having one primary input for every primary output of said combinational circuit and one primary output for every primary input of said combinational circuit, said backward network receiving signal values propagated to primary outputs in said first forward network in response to a said set of input test signals; and
   d) for each set of input test signals, computing criticality of paths in response to signal values propagated in first forward network, said computed criticality of paths indicating faults in said combinational circuit that are detectable by said input test signals and wherein the step of computing criticality of paths includes determining criticality of each stem from critical values of its connected fanout branches.

14. A method for simulating faults in a digital combinational circuit as claimed in claim 13, wherein said step d) of computing criticality of paths includes determining criticality of inputs at a logic gate located in said combinational circuit from values present at said inputs of said logic gate in said first forward network and a criticality value of the output of said gate.

15. A method for simulating faults in a digital combinational circuit as claimed in claim 13, wherein said step of determining criticality of each stem includes the step of injecting a fault at a said stem in said second forward network, said second forward network propagating fault effect values towards an observation point in said second forward network, and comparing values at observation points in said first and second forward networks to detect presence of said inserted fault in said second forward network, said stem being critical when said injected fault is detected.

16. A method for simulating faults in a digital combinational circuit as claimed in claim 15, wherein said step of injecting a fault at said stem in said second forward network includes swapping a present value at said stem with its complement.

17. A method for simulating faults in a digital combinational circuit as claimed in claim 15, wherein said stems contained in said combinational circuit are organized by levels, an initial level comprising primary outputs of said digital combinational circuit, and stems at any subsequent level i being fed only by stems at levels greater higher than i, said step of computing criticality of stems including computing criticality of stems in increasing level order.

18. A method for simulating faults in a digital combinational circuit as claimed in claim 17, wherein said step of determining criticality at each said stem in said second forward network includes issuing a request for a fault insertion of a stem at a level i, and dynamically grouping one or more stems at said level i that are compatible in response to said issued request.

19. A method for simulating faults in a digital combinational circuit as claimed in claim 18, wherein each compatible stem at a level i has fanout branches that propagate fault effect values capable of reaching different observation points in said second forward network.

20. A method for simulating faults in a digital combinational circuit as claimed in claim 19, wherein said step of injecting a fault at said stem in said second forward network includes simultaneously injecting a fault at each stem found compatible at said level, and propagating fault effect values to observation points for determining criticality of each compatible stem.

* * * * *